United States Patent [19]

Blackmer et al.

[11] Patent Number: 4,473,793
[45] Date of Patent: Sep. 25, 1984

[54] BIAS GENERATOR

[75] Inventors: David E. Blackmer, Wilton, N.H.; David R. Welland, Boston, Mass.

[73] Assignee: DBX, Inc., Newton, Mass.

[21] Appl. No.: 247,648

[22] Filed: Mar. 26, 1981

[51] Int. Cl.³ .............................................. G05F 3/08
[52] U.S. Cl. .................................... 323/311; 307/297; 323/907
[58] Field of Search ................ 307/260, 297; 323/311, 323/320, 907

[56] References Cited

U.S. PATENT DOCUMENTS 4,093,907 6/1978 Nutz ................................ 307/297 X
4,390,799 6/1983 Schmoock ...................... 307/297 X

FOREIGN PATENT DOCUMENTS

| 31678 | 8/1981 | European Pat. Off. |
| 863336 | 3/1961 | United Kingdom . |
| 867954 | 5/1961 | United Kingdom . |
| 1002049 | 8/1965 | United Kingdom . |
| 1072047 | 6/1967 | United Kingdom . |
| 1072947 | 6/1967 | United Kingdom . |
| 1234983 | 6/1971 | United Kingdom . |
| 1351685 | 5/1974 | United Kingdom . |
| 1471600 | 4/1977 | United Kingdom . |
| 1475507 | 6/1977 | United Kingdom . |
| 2054219 | 2/1981 | United Kingdom . |

Primary Examiner—William M. Shoop
Attorney, Agent, or Firm—Schiller & Pandiscio

[57] ABSTRACT

An improved bias generator provides a bias voltage output which is a function of an input current Iprog and provides a bias current to a preselected load which tracks the input signal independently of temperature. The amount the bias voltage output changes with temperature is determined by (1) V(T, Iprog), a voltage-current temperature dependent function of the base-emitter voltage drop of at least one transistor and (2) X, a scalar which is easily provided by setting the ratio of two resistors. The generator can therefore be easily constructed for particular circuit loads which include at least one semiconductive junction such that the biasing current through the load will be substantially independent of temperature.

23 Claims, 8 Drawing Figures

BIAS GENERATOR

The present invention relates generally to a bias generator, and more particularly to a supply for providing a bias voltage which is programmable by an input current and which varies in accordance with a predetermined current temperature function.

Many circuits used in information transmission systems require biases to operate. Many of the supplies for providing biasing will generate biasing signals at their outputs which signals vary with changes in ambient temperature because of the particular components of the supplies. In some instances variations in biasing signal output, due to changes in ambient temperature, may have little effect on the transmitted signal through the circuit with which the bias generator is used. On the other hand, it may have a significant effect on errors appearing at the output of the circuit.

In copending U.S. patent application Ser. No. 137,427 filed by David R. Welland on Apr. 4, 1980, and issued on May 11, 1982 as U.S. Pat. No. 4,329,598 (assigned to the present assignee and hereinafter referred to as the "Welland" patent) an improved bias generator is described. The generator comprises means for setting the level of the bias voltage so that the bias voltage varies in accordance with a predetermined relationship with temperature.

As described in the Welland patent in some situations the load of the circuit to which the generator is connected may also exhibit characteristic changes in accordance with temperature variations due to the design of the circuit. Where it is desirable to keep the current through the load independent with changes of temperature, the voltage current temperature function of the generator can be matched with the voltage-current temperature function of the load provided by the circuit so that variations of the bias voltage with changes in ambient temperature will be offset by variations in the circuit load due to the same temperature changes and the current through the load in response to the bias voltage will be independent of temperature.

The Welland patent describes as a specific embodiment of this concept, a bias generator for providing a bias signal to an operational rectifier circuit of the type described and claimed in U.S. Pat. No. 4,097,767 issued to David E. Blackmer and C. Rene Jaegar on June 27, 1978. The biasing of the rectifying cell of the circuit reduces the slew rate requirements of the operational amplifier for a given level of performance and at the same time produces a circulating current through the cell. This in turn produces a current error at the output of the circuit. In the Welland patent, one of the important design considerations of the bias generator shown is to provide an appropriate circulating current whose value (which in previous biasing schemes varied with the biasing voltage as a function of temperature) is substantially independent of temperature. The maximum level of the circulating current is established by the ratio of the resistance values of two resistors and the levels of bias currents flowing in the bias generator. The resulting bias voltage equals the voltage drop across the base-emitter junction of one or more reference transistors minus the voltage drop across a reference resistor. The voltage drop across the resistor is in turn a function of the difference in voltage drops between the base-emitter junctions of one or more first reference transistors when conducting a first reference current, and the base-emitter junctions of one or more second reference transistors (of like number, conductivity type and Vbe/Ic characteristics as the first reference transistors) when conducting a second reference current different from the first reference current. Thus, by matching the first reference transistors as well as the second reference transistors (in number, conductivity type and Vbe/Ic characteristics) to the transistors of a circuit load, changes in the voltage drop across the base-emitter junction of the transistors of the load due to changes in the biasing voltage output will not effect the level of the circulating current. In this manner the maximum acceptable current error produced by the circulating current can be easily predicted, will be reproducible from chip to chip, and is temperature independent.

Under other circumstances however, it may be desirable to control a bias voltage level of a bias generator with a single input signal while at the same time matching the output voltage-current temperature relationship of the generator to an intrinsic temperature dependent parameter or parameters of a load. By way of example and not limitation, the temperature dependent parameter, as the term is used hereinafter, is the ideal saturation current Is of a transistor and also can be the thermal voltage $KT/q$; or other intrinsic parameters such as parasitic emitter resistance, etc.

It is therefore an object of the present invention to provide an improved bias generator for providing a bias voltage as a function of a programmable input signal.

It is another object of the present invention to provide an improved bias generator for providing a bias voltage output which varies with temperature in accordance with a predetermined voltage-current temperature function.

Another object of the present invention is to provide an improved bias generator for providing a bias voltage output to a circuit load, the output varying with temperature so as to cancel the effects of changes in temperature dependent parameters of a circuit load.

Yet another object of the present invention is to provide an improved bias generator having a voltage output in accordance with a predetermined voltage-current temperature function and an easily settable scaling factor depending upon the circuit load.

Still another object of the present invention is to provide an improved bias generator for providing a bias voltage as a function of (1) a predetermined voltage-current temperature relationship which is easily provided with one or more transistors and (2) a scaling factor which is determined by the ratio of the values of two resistors.

And yet another object of the present invention is to provide an improved bias generator of a relatively simple design, easily manufacturable in integrated circuit (IC) form.

And still another object of the present invention is to provide an improved bias generator for providing a bias signal which varies in accordance with a predetermined voltage-current temperature relationship which includes the voltage-current temperature function of the base-emitter junction of one or more transistors of one or both conductivity types.

These and other objects of the present invention are provided by an improved bias generator for providing a bias voltage as a function of an input signal while at the same time providing a prescribed bias current output designed for a particular type load which output tracks the input signal. The voltage-current temperature relationship of the generator is matched to a combination of intrinsic temperature dependent parameters of a load. Preferably, the voltage-temperature relationship of the generator is a function V(T, Iprog) of the temperature dependent and current dependent voltage drop across the base-emitter junction of at least one transistor, multiplied by X, a scaling factor, which can easily be determined by the ratio of two resistors.

Other objects of the invention will in part be obvious and will in part appear hereinafter. The invention accordingly comprises the apparatus possessing the construction, combination of elements and arrangement of parts which are exemplified in the following detailed disclosure and the scope of the application of which will be indicated in the claims.

For a fuller understanding of the nature and objects of the present invention, reference should be had to the following detailed description taken in connection with the accompanying drawings wherein.

In the drawings, the same numerals are used to refer to like parts.

Figure 1:
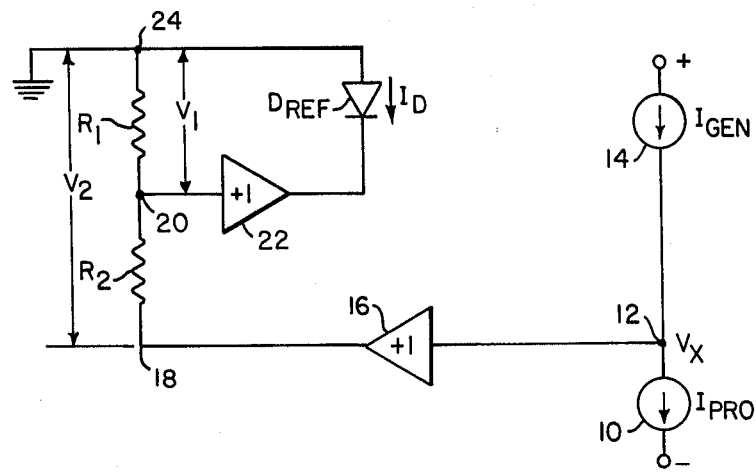
FIG. 1 is a circuit diagram of a network of one embodiment of the present invention.
Figure 3:
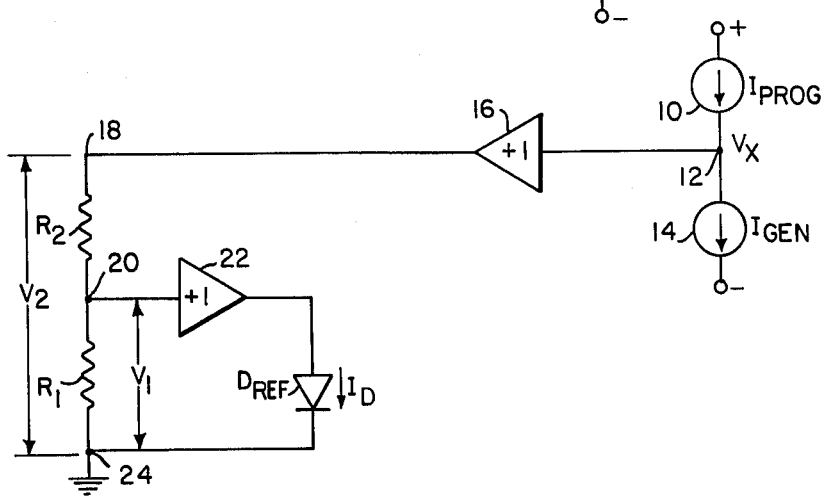
FIG. 3 is a circuit diagram of a network of another embodiment of the present invention.

Referring to FIGS. 1 and 3, the networks shown each illustrate a generator for producing an output voltage V2 (1) programmable by an input current Iprog and (2) a function of (a) the voltage V1 [the latter being a current temperature dependent function V(T, Iprog) dependent on the particular voltage-current temperature dependent reference device, shown generally as Dref] across resistor R1, multiplied by (b) a scalar X [the latter being a function of the ratio of the resistors R2 and R1].

Referring to FIG. 1, the network shown is provided with an input current Iprog shown as a current source connected to junction 12 so as to draw current from that junction. Junction 12 is also connected to a dependent current generator 14 so as to provide a current at a level dependent on the current Id through device Dref to the junction 12, and to the input of a plus-one follower or amplifier 16 which provides a voltage gain of one while theoretically providing infinite current gain. The output of amplifier 16 is connected with resistor R2 to junction 18. Resistor R2 is in turn connected to a second plus-one follower or amplifier 22, and through resistor R1 to junction 24. The junction 24 and the output of amplifier 22 are respectively connected to the current input and output of the voltage-current temperature dependent reference device Dref, which as shown is a diode, the latter having its anode connected to junction 24 and cathode connected to the output of amplifier 22.

Generally, in operation the voltage provided by Dref varies with temperature in accordance with a preselected current temperature-dependent function. For transistors the collector current Ic equals the temperature dependent saturation current Is(T) multiplied to a power Vbe (the base-emitter voltage)/Vt, where Vt, the thermal voltage, equals kT/q. As seen in connection with FIG. 2 the network of FIG. 1 is designed so that Dref preferably includes the base-emitter junction of at least one PNP transistor. Since amplifier 22 provides a voltage gain of one the voltage provided across Dref appears across resistor R1 as voltage V1. The circuit provides negative feedback so that the current through Dref, Id follows or tracks Iprog.

More specifically, as designed Igen equals Iprog so that no error signal is generated at the junction 12 to the follower 16. If Id were to decrease so that Igen is less than Iprog, Igen (dependent on Id) would decrease generating an error current to generator 16 and the voltage Vx at junction 12 would be pulled down (ideally infinitely) with respect to the low impedance node 24 so that the voltage V2 would increase. This would result in voltage V1 increasing. If V1 was to increase the voltage across Dref also would increase, increasing Id until Igen equals Iprog.

If Id were to increase so that Igen is greater than Iprog, the error current signal would be generated at junction 12 and the voltage Vx at junction 12 also would rise with respect to node 24. As a result the voltage V2 would decrease, decreasing voltage V1. A decrease in voltage V1 decreases the current through Dref until Igen equals Iprog.

Thus, if Id were to decrease or increase with respect to Iprog, the error thus created will cause Id to tend toward Iprog. Id is therefore programmed by the level of Iprog. Id in turn determines the level of voltage V1 which in turn determines the level of voltage V2. Voltage V2 thus is determined by the level of Iprog.

Figure 2:
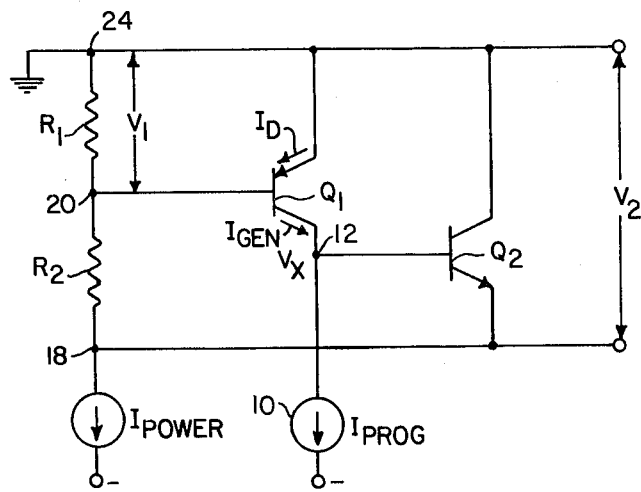
FIG. 2 is a circuit schematic of a realization of the network of FIG. 1.

The network of FIG. 1 can be easily realized in circuit form as shown in FIG. 2, wherein Dref is the base-emitter junction of at least a single PNP transistor Q1. In this embodiment the emitter current of transistor Q1 is equivalent to the current Id in the network of FIG. 1, the collector of transistor Q1 provides current Igen, and junction 12 appears at the base of transistor Q2. The amplifier 16 is provided by transistor Q2 which is biased by the current source connected to junction 18 and providing Ipower, so that transistor Q2 functions as a plus one follower.

In operation, the collector current (Igen) of transistor Q1 equals Iprog. The emitter current (Id) of transistor Q1 is slightly greater than Igen (equal to Igen plus the level of base current of transistor Q1), and if the base current of transistor Q1 is neglected the two currents Id and Igen can be thought of as equal. Where the emitter current (Id) of transistor Q1 decreases relative to Iprog (whether Iprog increases with respect to the emitter current, or the emitter current decreases with respect to the Iprog current), the collector current (Igen) responsively decreases, an error current is generated at junction 20 and the voltage (Vx) at the base of transistor Q2 is pulled further down away from the voltage level at node 24. This results in an increase in the voltage V2 across resistors R1 and R2. When the voltage V2 increases, the voltage V1 across resistor R1 increases so as to increase the voltage across the base-emitter junction of transistor Q1 so that the emitter current increases to the level where the collector current equalizes to approximately the level of Iprog. Conversely, where the emitter current (Id) of transistor Q1 increases with respect to Iprog (e.g., Iprog decreases with respect to the emitter current) the voltage (Vx) at junction 12 also rises closer to the voltage level at the low impedance node 24. Consequently, the voltage V2 will decrease, decreasing the voltage V1. This results in a decrease in the current in the emitter current of transistor Q1 to the level where the collector current equalizes with Iprog.

Further, with respect to FIGS. 1 and 2, the voltage V1 across the resistor R1 is equal to the voltage-current temperature dependent function V(T, Iprog) of the reference device Dref (in the circuit configuration of FIG. 2 Dref is the base-emitter junction of PNP transistor Q1). Neglecting the base current in transistor Q1, the current through resistor R1 is equal to the current through resistor R2. The current can be defined as V1/R1 so that V2 can be defined as V1+(V1/R1) R2, or V1 (1+R2/R1). The voltage V2 can thus be thought of as a temperature-dependent and current dependent voltage V(T, Iprog) equal to V1, multiplied by a scalar X equal to (1+R2/R1), wherein X will be equal to at least one and may be any integer or mixed number.

Figure 4:
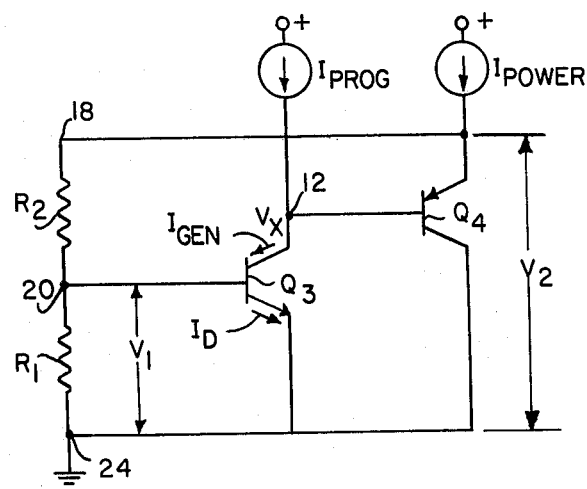
FIG. 4 is a circuit schematic of a realization of the network of FIG. 3.

The network shown in FIG. 3 is a modification over the network shown in FIG. 1, wherein the voltage-current temperature dependent reference device Dref includes the base-emitter junction of at least one NPN transistor as shown in FIG. 4. Referring to FIG. 3, the input current Iprog of generator 10 flows into junction 12 while Igen of generator 14 flows from junction 12. Junction 12 is connected to the input of amplifier 16 which in turn has its output connected to the junction 18. Junction 18 is connected through resistor R2 to the junction 20, while junction 20 is connected to resistor R1 and the input of amplifier 22. The output of amplifier 22 is connected to the current input of device Dref, while the current output of Dref is connected to resistor R1 at junction 24 which forms the low impedance node.

In operation, Igen equals Iprog. If Id were to decrease with respect to Iprog, Igen would decrease with respect to Iprog, making the junction 12 more negative with respect to junction 24, and therefore increasing Vx. Increasing Vx, would result in an increase in V2. An increase in V2 would result in an increase in V1 which would increase Id to the point where Igen equals Iprog. If Id were to increase with respect to Iprog, Igen would increase with respect to Iprog, making the junction 12 less negative with respect to junction 24, and therefore decreasing Vx. If Vx were to decrease, V2 would decrease resulting in a decrease in V1. This results in a decrease in Id to the point where Igen equals Iprog. Thus, Igen will always approximate Iprog.

The network of FIG. 3 is particularly useful for a voltage-current temperature dependent reference device which includes the base-emitter junction of at least one NPN transistor as shown in FIG. 4. In this circuit realization, the emitter current of transistor Q3 is equivalent to the current Id in the network of FIG. 3, the collector of transistor Q3 provides current Igen, and the junction 12 appears at the base of transistor Q4. Transistor Q4 is biased by the current source connected to junction 18 so that transistor Q4 functions as plus one follower 16.

In operation, if the emitter current (Id) of transistor Q3 were to decrease with respect to Iprog, the collector current (Igen) would responsively decrease and the voltage (Vx) at the base of transistor Q4 would be pulled further from the junction voltage level at node 24. This results in the voltage V2 across resistors R1 and R2 increasing. When the voltage V2 increases, the voltage V1 across resistor R1 increases so as to increase the voltage across the base-collector junction of the transistor Q3, increasing the emitter current so that the collector current of transistor Q3 equalizes to the level of Iprog. Conversely, if the emitter current (Id) of transistor Q3 were to increase with respect to Iprog, the collector current increases so that the voltage (Vx) at junction 12 drops closer to the voltage level at the low impedance node 24. Consequently, the voltage V2 will decrease, decreasing V1. This results in a decrease in the current in the emitter current of transistor Q3 which in turn causes a decrease in the collector so as to equalize with Iprog.

In the embodiment of FIG. 4, the voltage V2 is a function of V(T, Iprog) of the voltage-current temperature drop of the base-emitter junction of an NPN transistor, transistor Q3; and the scalar X is equal to (1+R2/R1).

Figure 5:
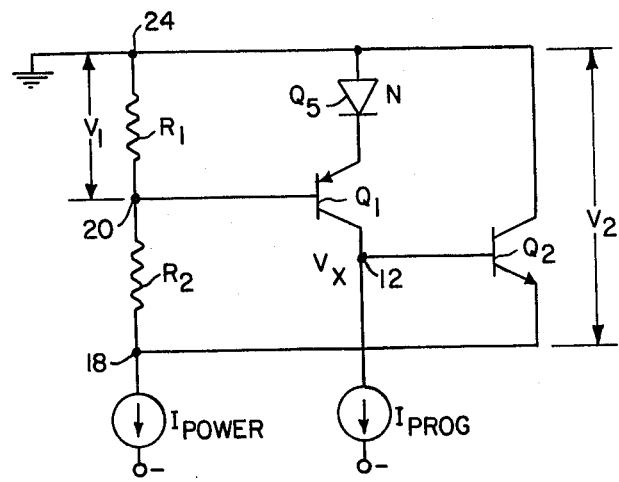
FIG. 5 is a circuit schematic of a modification to the FIG. 2 embodiment.

It should be readily apparent from FIGS. 1-4 that the voltage-current temperature dependent function V(T, Iprog) can be dependent upon any number of base-emitter junctions of any number of PNP or NPN transistor, or combination of PNP and NPN transistors by diode connecting the additional reference transistors in the emitter circuit of transistor Q1 of FIG. 2 or the emitter circuit of transistor Q3 of FIG. 4. For example, it may be desirable for the voltage V(T, Iprog) to vary in accordance with the base-emitter junction of PNP and/or NPN transistors each having different Vbe/Ic transfer characteristics. Conversely, where the desired voltage-current temperature relationship is a function of the base-emitter junctions of more than one transistor each having the same Vbe/Ic transfer characteristics, the voltage V2 can be adjusted by the scalar X (1+R2/R1) and in particular by adjusting the ratio R2/R1 to insure the proper biasing voltage output. For example, as shown in FIG. 5, an additional transistor Q5 (connected in a diode mode) is combined with the base-emitter of transistor Q1 to form the voltage-current temperature dependent reference device of the FIG. 2 network. The diode-connected transistor Q5 can be a PNP transistor (exhibiting different Vbe/Ic characteristics from transistor Q1) having its emitter connected to the node 24 and its base and collector connected to the emitter of transistor Q1, or an NPN transistor having its collector and base connected to node 24 and its emitter tied to the emitter of transistor Q1 as shown more fully in FIG. 6. The voltage V1 generated across resistor R1 is thus a function V(T, Iprog) of the voltage drop across the base-emitter junctions of two transistors Q1 and Q5.

Figure 6:
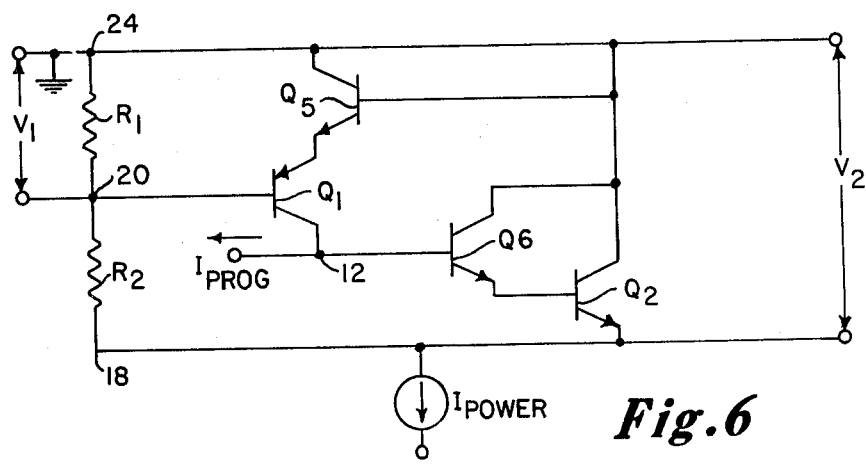
FIG. 6 is a circuit schematic showing a further modification to the FIG. 2 embodiment.

Referring to FIG. 6, the FIG. 5 circuit is further improved by increasing the current gain of the plus one follower provided by transistor Q2. In particular, transistor Q2 is connected with transistor Q6 so as to function as an emitter follower. Specifically, the base of transistor Q6 is connected to junction 12, the collector connected to the collector of transistor Q2 and the emitter is connected to the base of transistor Q2. This increases the current gain provided by the follower by a multiple equal to the current gain of transistor Q6.

Figure 7:
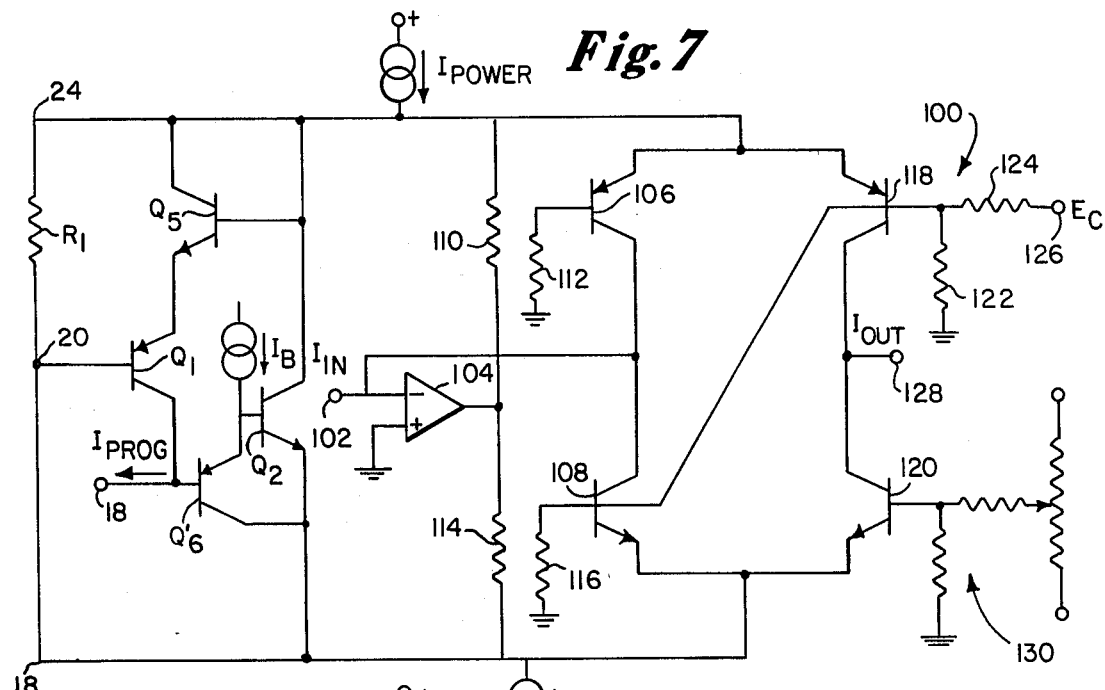
FIG. 7 is a circuit diagram illustrating the FIG. 6 embodiment with a scaling factor X equal to one for biasing a four transistor gain cell of a voltage control amplifier.

The generator of the present invention is particularly useful in providing a bias signal to a voltage controlled amplifier (VCA) gain cell. As shown in FIG. 7, the FIG. 6 embodiment (slightly modified) is connected to the bias terminals of a four transistor cell of a voltage control amplifier (VCA), while in FIG. 8, the FIG. 6 embodiment is used to bias an eight transistor gain cell of a VCA, both being described in copending application Ser. No. 247,829 simultaneously filed with the present application by David E. Blackmer, assigned to the present assignee and issued on Sept. 6, 1983 as U.S. Pat. No. 4,403,199 hereinafter referred to as the "Blackmer" patent, which application is a continuation-in-part of application Ser. No. 131,220 filed Mar. 17, 1980, now abandoned.

In FIG. 7, the four transistor gain cell VCA 100 comprises an input terminal 102 for receiving the current input. Terminal 102 is connected to the negative input terminal of operational amplifier 104, the latter having its positive input grounded. A PNP transistor 106 and a NPN transistor 108 are respectively connected in separate feedback paths (one for positive and the other for negative input signals) between the negative input and output terminals of amplifier 104 so as to provide a signal at the output of the amplifier 104 which is a function of the logarithm of the input current at terminal 102. Specifically, PNP log transistor 106 has its emitter connected through resistor 110 to the output of amplifier 104, its base through resistor 112 to system ground and its collector to the input terminal 102. NPN log transmitter 108 has its emitter connected through resistor 114 to the output of amplifier 104, its base connected through resistor 116 to system ground and its collector connected to the input terminal 102.

The output of amplifier 104 is also coupled through transistors 118 and 120 for providing antilog signal conversion. Specifically, PNP antilog transistor 118 has its emitter connected to the emitter of log transistor 106; its base connected through resistor 122 to system ground, through resistor 124 to a terminal 126 for receiving the voltage control signal Ec, and directly to the base of log transistor 108; and its collector to output terminal 128. NPN antilog transistor 120 has its emitter connected to the emitter of transistor 108, its base connected to suitable means 130 for providing symmetry adjustment with respect to the two log - antilog signal paths (one path being defined by transistors 106 and 118 and the other path being defined by transistors 108 and 120), and its collector to the output terminal 128. The NPN transistors 108 and 120 are matched for their Vbe/Ic transfer characteristics and similarly the PNP transistors 106 and 118 are matched for theirs.

The log transistors 106 and 108 are biased and similarly the antilog transistors are biased with a voltage applied between the common emitters of transistors 106 and 118 and the common emitters of transistors 108 and 120. It is preferred that the bias voltage vary with temperature in such a manner so that the biasing current through the cell remains substantially independent of temperature. Specifically, the bias voltage should vary with temperature in a manner such that changes in the temperature dependent parameters of the circuit load provided by PNP log transistor 106 and NPN log transistor 108 and by PNP antilog transistor 118 and NPN antilog transistor 120 are compensated for whereby the biasing current through the cell while varying with changes in the control voltage applied to terminal 126 remains substantially independent of temperature. Accordingly, the bias generator of FIG. 6 can be used where transistors Q1 and Q5 are matched for their Vbe/Ic transfer characteristics with the corresponding PNP and NPN transistors of the circuit load. Since one NPN and one PNP transistor are provided in each circuit load, $X=1$ and $R2/R1=0$. Thus, R2 is reduced to zero ohms by directly connecting junction 20 to the junction 18. With this modification, in order to prevent saturation of transistor Q1, it is necessary to substitute a PNP transistor Q6' for the NPN transistor Q6 of FIG. 6 with the collector of transistor Q6' connected to the emitter of transistor Q2, the emitter of transistor Q6 to the base of transistor Q2 and to a source of bias current IB. In order to provide current through the cell 100 which will remain substantially independent of temperature and substantially constant for unity gain, junction 12 is connected to a source of constant current such as shown in our copending Ser. No. 247,830 simultaneously filed herewith and abandoned in favor of U.S. Ser. No. 387,822 (now U.S. Pat. No. 4,377,792 issued on Mar. 22, 1983), so that the biasing current through cell 100 remains constant at unity gain as well as independent of temperature.

Figure 8:
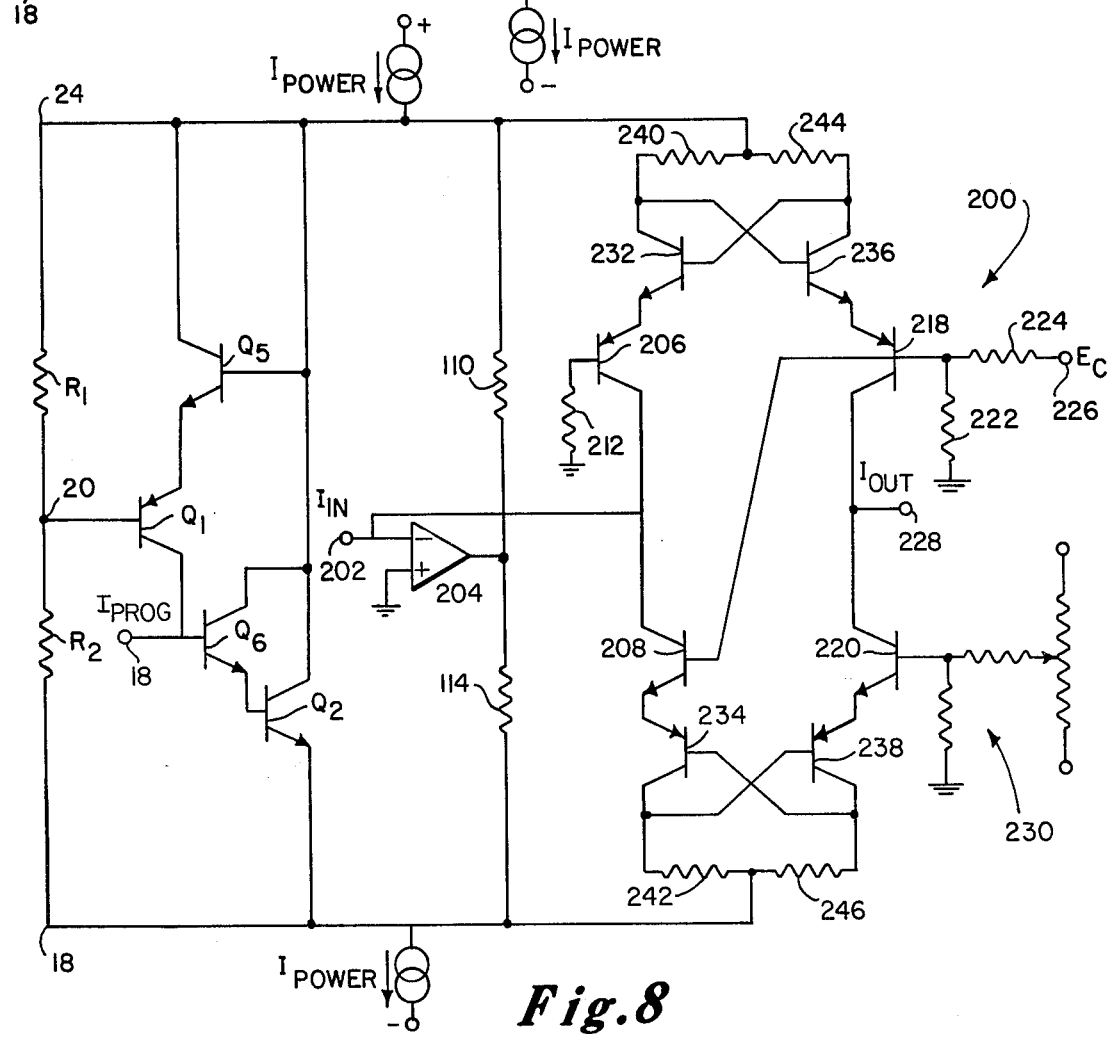
FIG. 8 is a circuit diagram illustrating the FIG. 6 embodiment with a scaling factor X equal to two for biasing an eight transistor gain cell of a voltage control amplifier.

In a similar manner, the bias generator of FIG. 6 can be used to bias an eight transistor gain cell VCA 200 as shown in FIG. 8. VCA 200 is similar to VCA 100 in that the input terminal 202 is connected to the negative input terminal of amplifier 204, the latter having the PNP log transistor 206 and NPN log transistor 208 connected in separate feedback paths of the amplifier. PNP antilog transistor 208 and NPN antilog transistor 220 provide antilog signal conversion. The control signal Ec is added at terminal 226 while symmetry is provided by means 230. A secondary transistor 232, 234, 236 and 238 of an opposite conductivity type are respectively connected to the log and antilog transistors for providing compound log and antilog devices for converting the respective signals as described in the Blackmer application. Secondary transistors 232, 234, 236 and 238 also provide both amplification within the log and antilog paths and cancellation of errors between each PNP and NPN compound pair of log and antilog transistors in each log-antilog path. Finally, as taught in the Blackmer patent means are provided in each log-antilog transmission path for detecting the differences between the input and output signals due to errors created by the parasitic base and emitter resistances of the transistors and for providing a correction signal to each path. Specifically, the resistors 240, 242, 244 and 246 are respectively connected in the corresponding collector paths of the secondary transistors 232, 234, 236 and 238; and the base of the secondary transistors within each log-antilog path are directly cross coupled with the collector of the other secondary transistor of the same path. All PNP and NPN transistors are matched for their Vbe/Ic characteristics. Each circuit load of the VCA 200 thus includes two matched PNP and two matched NPN transistors. Accordingly, the FIG. 6 bias generator can be utilized wherein PNP transistor Q1 and NPN transistor Q5 are each respectively matched for its Vbe/Ic characteristics with the corresponding group of PNP and NPN transistors of VCA 200. The scaling factor X equals two so that $R2=R1$.

It will be appreciated from the foregoing that the bias generator of the present invention can be designed for any type of circuit load including at least one semiconductive junction having temperature dependent parameters. By providing the appropriate base-emitter voltage drop functions of the appropriate transistors in parallel with resistor R1 to establish the function V(T, Iprog), and the appropriate ratio R2/R1 to establish the scaling factor X (which can equal any integer equal to one or greater or any mixed number) one can match the function V(T, Iprog)·X with a similar current temperature dependent voltage drop across a load so that the current through the load including at least one semiconductive junction tracks Iprog independent of temperature.

Since certain changes may be made in above apparatus without departing from the scope of the invention herein involved, it is intended that all matter contained in the above description or shown in the accompanying drawing shall be interpreted in an illustrative and not in a limiting sense.

What is claimed is:

1. A signal generator adapted to be connected across a predetermined circuit load characterized by at least one temperature dependent parameter related to the voltage drop across the base-emitter junction of at least one transistor to its collector current, said generator comprising
   means for generating a bias current to said load in response to a bias voltage applied across said load, said bias voltage being responsive to a signal input to said generator such that the signal generated in said load tracks said input signal independent of temperature, said bias voltage being a voltage (current, temperature) function V(T, I) related to the voltage drop across the base-emitter junction of at least one transistor multiplied by a scalar X.

2. A signal generator according to claim 1, wherein said generator includes voltage-current temperature dependent reference means for defining V(T, I), wherein said reference means includes the base-emitter junction of each type of and matched with respect to each transistor of said circuit load exhibiting different Vbe/Ic transfer characteristics.

3. A signal generator according to claim 2, wherein said generator includes two resistors for defining said scalar X.

4. A signal generator according to claim 3, wherein said two resistors respectively, R1 and R2 are coupled together so that a voltage equal to V(T, I) is generated across resistor R1, said scalar equals (1+R2/R1) and said bias voltage is generated across both resistors.

5. A signal generator according to claim 4, wherein the scalar X is equal to or greater than one.

6. A signal generator for providing a bias voltage across a circuit load, said generator comprising
   a pair of output terminals adapted to be connected across said circuit load;
   first resistive means coupled between said output terminals and having a resistance value equal to R1;
   signal generating means for generating a first current temperature dependent voltage across said first resistive means wherein said current temperature dependent voltage is a function of the base-emitter voltage drop across at least one transistor with a predetermined collector current; and
   second resistive means coupled between said output terminals and to said first resistive means and having a resistance value equal to R2 for providing in response to said first voltage signal a second voltage signal equal to (R2/R1) multiplied by said first voltage signal;
   wherein said first and second voltage signals are additive to provide said bias voltage between said output terminals.

7. A generator according to claim 6, wherein said first and second resistive means are respectively resistors coupled together and between said output terminals.

8. A generator according to claim 7, wherein said signal generating means includes the base-emitter junction of at least one transistor coupled with said first resistive means so that a voltage generated across said junction appears across said first resistive means.

9. A signal generator according to claim 8, wherein said bias voltage is a function of an input signal and the current generated through said circuit load by said bias voltage tracks said input signal.

10. A signal generator according to claim 9, wherein said input signal is an input current, said generator further including means for generating a dependent current flowing through the collector of said at least one transistor; means for generating an error signal responsively to differences between said dependent current and said input current; means responsive to said error signal for adjusting said first temperature dependent voltage across said first resistive means so that said dependent current equalizes with said input current in response to said error signal.

11. A signal generator according to claim 10, wherein said means for adjusting said first temperature dependent voltage includes means providing unity voltage gain.

12. A bias signal generator for providing a bias voltage across a circuit load having temperature dependent parameters matched to that of a temperature dependent parameters of said generator, said load being of the type providing a current temperature dependent voltage drop equal to X multiplied by the function V(T, I) wherein X is a scaling factor equal to or greater than one and V(T, I) is a function of the base-emitter current temperature dependent voltage drop of at least one transistor, said generator comprising
   a pair of output terminals adapted to be connected across said circuit load;
   resistive means coupled between said output terminals;
   signal generating means for generating a first voltage signal across said resistive means equal to the function V(T, I) of said load; and
   means coupled to said resistive means for providing in response to said first voltage signal a second voltage signal equal to (X−1) multiplied by the function V(T, I);
   wherein said first and second voltage signals are additive to provide said bias signal between said output terminals.

13. A bias signal generator according to claim 12, wherein said resistive means has a resistance value equal to R, and said means for providing said second voltage signal includes second resistive means coupled with said first resistive means and having a resistance value equal to (X−1) multiplied by R.

14. A bias signal generator according to claim 12, wherein said bias voltage is a function of an input signal and the current generated through said circuit load by said bias voltage tracks said input signal independently of temperature.

15. In combination with a circuit load characterized by temperature dependent parameters, an improved generator having a matched temperature dependent parameters and comprising
   means for generating a signal to said load in response to an input signal to said generator such that the signal generated to said load tracks said input signal independently of temperature;
   wherein said temperature dependent parameters of said load are a function of the voltage drop across the base-emitter junction of at least one transistor.

16. The combination according to claim 15, wherein said input signal and said signal generated to said load are each a current.

17. The combination according to claim 16, wherein said load includes the base-emitter junction of a pair of log or antilog transistors of the transistor cell of a voltage control amplifier.

18. The combination according to claim 17, wherein said pair of transistors includes a PNP and an NPN transistor.

19. The combination according to claim 16, wherein said load includes the base-emitter junction of four log or anti-log transistors of an eight transistor gain cell of a voltage control amplifier and includes a pair of PNP and a pair of NPN transistors.

20. In combination with a circuit load providing a temperature dependent voltage drop equal to X multiplied by the function V(T, I), wherein X is a scaling factor greater than or equal to one and V(T, I) is a function of the base-emitter voltage drop of at least one transistor, an improved bias generator for providing a bias signal across said circuit load, said generator comprising a pair of output terminals connected across said circuit load;

first resistive means coupled between said terminals;

signal generating means for generating a first voltage signal across said resistive means equal to the function V(T, I); and means coupled to said resistive means for providing in response to said first voltage signal a second voltage signal equal to (X−1) multiplied by the function V(T, I);

wherein said first and second voltage signals are additive to provide said bias signal across said terminals.

21. The combination according to claim 20, wherein said circuit load includes the base-emitter junction of a pair of log or anti-log transistors of a transistor cell of a voltage control amplifier.

22. The combination according to claim 21, wherein said pair of transistors collectively comprise a PNP and an NPN transistor.

23. The combination according to claim 21, wherein said circuit load further includes the base-emitter junction of four log or anti-log transistors of an eight transistor gain cell of a voltage control amplifier, and includes two NPN and two PNP transistors.

* * * * *